(12) United States Patent
Fuji et al.

(10) Patent No.: US 6,998,715 B1
(45) Date of Patent: Feb. 14, 2006

(54) GRID ARRAY ELECTRONIC COMPONENT, WIRE REINFORCING METHOD FOR THE SAME, AND METHOD OF MANUFACTURING THE SAME

(75) Inventors: Shouichi Fuji, Mie (JP); Akira Nakao, Mie (JP)

(73) Assignee: Suzuka Fuji Xerox Co., Ltd., Suzuka (JP)

( * ) Notice: Subject to any disclaimer, the term of this patent is extended or adjusted under 35 U.S.C. 154(b) by 58 days.

(21) Appl. No.: 10/088,086

(22) PCT Filed: Sep. 21, 2000

(86) PCT No.: PCT/JP00/06462

§ 371 (c)(1),
(2), (4) Date: Mar. 21, 2002

(87) PCT Pub. No.: WO01/22488

PCT Pub. Date: Mar. 29, 2001

(30) Foreign Application Priority Data

Sep. 22, 1999 (JP) ................................. 11/268063

(51) Int. Cl.
*H01L 23/48* (2006.01)
(52) U.S. Cl. ...................... 257/773; 257/774; 257/786; 257/738
(58) Field of Classification Search ................ 257/786, 257/738, 773–774
See application file for complete search history.

(56) References Cited

U.S. PATENT DOCUMENTS

| 5,784,262 | A | * | 7/1998 | Sherman | .................. | 361/777 |
| 5,815,374 | A | * | 9/1998 | Howell | .................. | 361/768 |
| 6,091,155 | A | * | 7/2000 | Jonaidi | .................. | 257/786 |
| 6,218,630 | B1 | * | 4/2001 | Takigami | .................. | 174/261 |

FOREIGN PATENT DOCUMENTS

| JP | 8-78825 | 3/1996 |
| JP | 11-97575 | 4/1999 |

* cited by examiner

*Primary Examiner*—Luan Thai
(74) *Attorney, Agent, or Firm*—Oblon, Spivak, McClelland, Maier & Neustadt, P.C.

(57) ABSTRACT

Grid array electronic component, wiring-strengthening method and producing method wherein a grid array electronic component in which a grid array LSI chip 2 having a large number of lands 3 connected to a large number of lands 13 through connecting means 30, the lands 13 are connected to a wire 4 of a printed wiring board 1, an auxiliary land 5 is formed at a connection portion 31 of the lands 13 on the printed wiring board 1 corresponding to the lands 3 of a corner portion of the grid array LSI chip 2 connecting the wire 4 and the concentration of stress of the connection portion 31 is moderated, thereby providing the effect that the brake of the wire in the connection portion 31 is prevented.

17 Claims, 10 Drawing Sheets

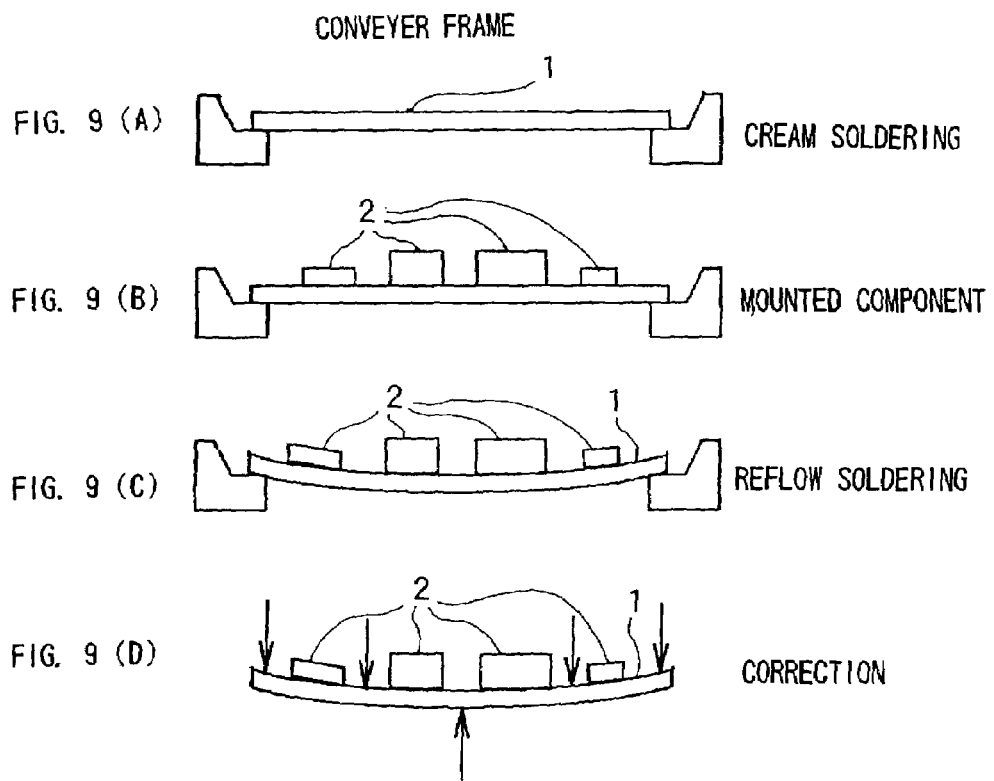
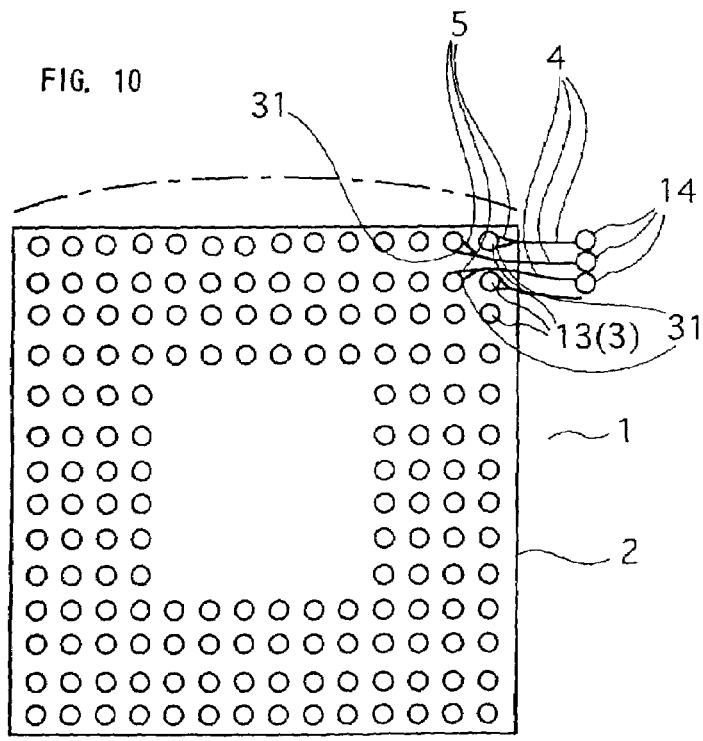

PRIOR ART

PRIOR ART

GRID ARRAY ELECTRONIC COMPONENT, WIRE REINFORCING METHOD FOR THE SAME, AND METHOD OF MANUFACTURING THE SAME

TECHNICAL FIELD

The present invention relates to a grid array electronic component in which a grid array LSI chip having a large number of lands connected to a wire of a printed wiring board through connecting means is disposed, wherein an auxiliary land is formed on a connection portion between the wire and a land of the printed wiring board corresponding to the land of the corner portion of the grid array LSI chip. The invention also relates to a wire strengthening method.

BACKGROUND TECHNIQUE

As shown in FIG. 18(A), in a conventional grid array electronic component, a via hole B of a printed wiring board K and a land L of the printed wiring board K corresponding to a large number of lands of a grid array LSI chip P mounted on the printed wiring board K are directly connected to each other through a wiring pattern H.

In a conventional wiring board having the lands (Japanese Patent Application Laid-open No.H8-213730 (improvement of a break caused by fracture based on difference of thermal expansion), Japanese Utility Model Application Laid-open Nos.S61-201374 and S62-184783 (improvement of land shape in accordance with high density of wire), Japanese Patent Publication No.S56-22151, and the like), as shown in FIG. 19, an auxiliary land AL is formed on a portion of a periphery or an entire periphery of through holes TH, and even if the through holes TH are deviated from each other, connection properties are secured.

In a conventional printed wiring board (Japanese Patent Applications Laid-open Nos.H1-115195, H11-54859 and S64-84875, as well as Japanese Patent No. 2519068), since there is a problem that if a tier drop is added to secure electrical conduction of a land in a printed board of epoxy glass or the like and to avoid a danger of brake of wire, the entire area of the land is increased and thus, density cannot be increased as compared with a case in which the tier drop is not added, a predetermined insulation gap cannot be obtained between the tier drop and another conductive circuit. Therefore, tier drops TD are offset with respect to a land L1, and the tier drops TD are formed on one side of a line or asymmetrically in a lateral direction as shown in FIG. 20.

In a mounting structure of a conventional ball grid array package (Japanese Patent Application Laid-open No.H10-335516), as shown in FIG. 21, in order to prevent thermal fatigue life of soldering from being lowered by reduction bonding force of soldering based on void caused by air trapped in the four corner via holes BH of the disposition region of a rectangular ball grid array package, flat pads PP are disposed instead of a pad BH for the via hole.

In the conventional grid array electronic component, the via hole B of the printed wiring board K and the land L of the printed wiring board K corresponding to a large number of lands of the grid array LSI chip P mounted on the printed wiring board K are directly connected to each other through the wiring pattern H. Therefore, if a load is applied to the printed wiring board K, a brake is generated in the wiring pattern H.

That is, if warpage and distortion are generated in the printed wiring board K, a great stress is applied to a connection portion between the wiring pattern H, the via hole B of the printed wiring board K and the land L of the printed wiring board K corresponding to the land of the grid array LSI chip. Therefore, a brake is generated in the connection portion of the wiring pattern H.

As shown in FIG. 19, the conventional wiring board having the land, the through holes TH are formed at a portion of its periphery or an entire periphery with an auxiliary land AL, and even if the through holes TH are offset from each other, the connection properties are obtained. Therefore, this is a technique related to a 2.54 mm pin grid array (PGA) between pins, and this is not a technique related to BGA of ball grid array LSI chip in which a large number of soldering balls having 1.27 mm pitch between pins are disposed on a lower surface of an LSI device.

In the conventional printed wiring board, if the tier drop is added to moderate the concentration of stress of the land of the printed board of epoxy glass or others of 1 mm thickness, the entire area of the land is increased. Therefore, there are problems that the density is not increased as compared with a case in which the tier drop is not added, and a predetermined insulation distance between the tier drop and other conductive circuit can not be secured. Thus, the tier drops TD are decentered with respect to the land L1, and are formed on one side of the line or asymmetrically in the lateral direction, and two leads D1 and D2 are interposed between adjacent lands L1 and L2, and this technique is judged as being one generation older technique of the ball grid array (BGA) in which a large number of surface-mounting type soldering balls of 1.27 mm pitch are disposed on a lower surface of the LSI device.

Further, in the conventional printed wiring board, since a brake of the wiring pattern when a load is applied to the printed wiring board to which the ball grid array type LSI chip is mounted is not prevented, the printed wiring board is different in wiring pattern and the like of the pitch, lead and the like of the land of the LSI device and printed board which is soldered to the printed board.

In the mounting structure of the conventional ball grid array package, a flat pad PP is disposed instead of a via hole pad BH in order to a void reduction of the soldering thermal fatigue life caused by reduction of the soldering bonding force based on void by air trapped in four corner via holes BH in disposition region of the rectangular ball grid array package, and a brake of the wiring pattern when a load is applied to the printed wiring board to which the ball grid array type LSI chip is mounted is not prevented. Therefore, the land whose wiring pattern is broken is not provided with an auxiliary land naturally.

DISCLOSURE OF THE INVENTION

Thereupon, the present inventor analyzed a wire failure caused by a brake of wiring pattern of the printed wiring board to which the ball grid array type LSI chip shown in FIG. 18(A) was mounted, and found that the brake was generated in a correction step which corrected warpage and distortion of the printed wiring board which was generated in a reflow soldering step, or in an assembling step of the printed wiring board.

Further, the present inventor found that a portion where the brake was generated was a region of about 1 mm of the connection portion C between the land L and the wiring pattern P as shown in FIG. 18(B), and a region where a brake of the ball grid array type LSI chip was generated was a region (portion) where an excessive tensile stress was applied between the land of the printed wiring board such as a corner portion of the ball grid array type LSI chip or an end of an IC chip and a wiring pattern as the connecting means.

It is assumed that the wire failure is caused in such a manner that warpage and distortion are generated in the printed wiring board by heating and a weight of the ball grid array type LSI chip itself when the latter is soldered and bonded to the printed wiring board, and when the warpage and distortion of the printed wiring board are corrected, the correction amount or a stress becomes maximum in the corner portion of the ball grid array type LSI chip or an end of the IC chip, and an excessive stress is applied to the connection portion between the land and the wiring pattern in order to break the wiring pattern. It is assumed that a brake of the wiring pattern caused when an excessive load is applied to the printed wiring board in the assembling step of the printed wiring board is generated by the same reason.

Thereupon, the inventor reached the present invention in which an auxiliary land is formed in the connection portion of a land connecting to a wiring pattern at a portion where an excessive stress is applied between the land of the printed wiring board and the wiring pattern as the connecting means when a load is applied to the printed wiring board.

Further, the inventor paid attention to a technical idea of the present invention in which in a grid array electronic component having a grid array LSI chip including a large number of lands connected to a large number of lands connected to a wire of a printed wiring board through connecting means, when a load is applied to the printed wiring board, an auxiliary land is formed on the connection portion of the land connecting to the wiring pattern at the portion where an excessive stress is applied between the land on the printed wiring board corresponding to the grid array LSI chip and the wiring pattern as the connecting means, and the concentration of stress of the connection portion is moderated, and repeatedly researched and developed and as a result, reached the present invention which achieved an object that a brake of the wiring pattern in the connection portion when a load is applied to the printed wiring board is prevented.

The present invention provides effect that at least concentration of stress on the connection portion of the land connecting to the wiring pattern at the portion where an excessive tensile stress is applied is moderated, thereby preventing a brake of the wiring pattern in the connection portion.

The present invention exhibits the same effect by determining the shape of the auxiliary land in consideration of the tensile stress applied to the connection portion between the wiring pattern and the land of the corner portion of the grid array electronic component as well as a shape of the pattern of the printed wiring board.

In the present invention, since the auxiliary land includes a cross section for connection of an average value in accordance with the stress applied to the connection portion when a load is applied to the printed wiring board, the strength of the lands of the corner portion are uniformed, and reliability is enhanced.

The present invention exhibits the same effect by moderating the concentration of stress of the connection portion between the wiring pattern and the through hole on the inner layer printed wiring board of the multilayer printed wiring board.

The present invention prevents a brake of the wire in the connection portion of the via hole of the printed wiring board by moderating the concentration of stress of the connection portion of the via hole on the printed wiring board when the load is applied to the printed wiring board.

The present invention prevents a brake of wiring pattern of one end of the printed wiring board on the side of the land.

According to a wire strengthening method of a thirteenth invention having the above-described structure, in the twelfth invention, the connection portion of the printed wiring board of the wire on the side of the via hole is also strengthened by forming the auxiliary land on the connection portion of the via hole on the printed wiring board connecting the wire and thus, there is effect that brakes on the opposite ends of the wire are prevented.

The present invention makes it possible to produce a grid array electronic component in which the connection portion of the printed wiring board of the wiring pattern on the side of the land is strengthened.

The present invention makes it possible to produce a grid array electronic component in which the connection portion of the printed wiring board of the wire on the side of the via hole is also strengthened.

A grid array electronic component of the present invention (the first invention set forth in claim 1) in which a grid array LSI chip having a large number of lands connected to a large number of lands through connecting means, the latter lands are connected to a wire of a printed wiring board, wherein an auxiliary land is formed at a connection portion of the land connecting a wiring pattern at portions where an excessive tensile stress is applied between the lands in the printed wiring board corresponding to the grid array LSI chip and the wiring pattern as the wire.

The grid array electronic component of the present invention (the second invention set forth in claim 2), according to claim 1, wherein the auxiliary land is formed at the land located on at least a portion where an excessive tensile stress as compared with another portion of the printed wiring board is applied when a load is applied to the printed wiring board.

The grid array electronic component of the present invention (the third invention set forth in claim 3), according to claim 2, wherein the auxiliary land is formed at the land located on a portion corresponding to a corner portion of the grid array LSI chip in the printed wiring board.

The grid array electronic component of the present invention (the fourth invention set forth in claim 4), according to claim 2, wherein the auxiliary land is formed at the land located on a portion corresponding to an end of an IC chip disposed in the grid array LSI chip in the printed wiring board.

The grid array electronic component of the present invention (the fifth invention set forth in claim 5), according to claim 2, wherein the auxiliary land is formed at the land connected to the wiring pattern which is formed in a direction in which a warpage of the printed wiring board is generated and in a direction closer to the former direction in a reflow soldering step of the grid array electronic component.

The grid array electronic component of the present invention (the sixth invention set forth in claim 6), according to claim 2, wherein the auxiliary land is formed at the land in which an excessive tensile stress is applied to the wiring pattern in a correcting step which corrects warpage and distortion of the printed wiring board or an assembly step.

The grid array electronic component of the present invention (the seventh invention set forth in claim 7), according to claim 2, wherein the auxiliary land is formed so that a connection cross section area from the land of the printed wiring board corresponding to the portion of the land of the grid array LSI chip to the wiring pattern is gradually varied.

The grid array electronic component of the present invention (the eighth invention set forth in claim 8) according to claim 3, wherein the auxiliary land is constituted by an auxiliary land having a different shape in accordance with a position of the land of the printed wiring board corresponding to the land of the corner portion of the grid array LSI chip.

The grid array electronic component of the present invention (the ninth invention set forth in claim 9), according to claim 3, wherein the auxiliary land is constituted so that an average value of a connection cross section area of a land closer to the printed wiring board corresponding to the land closer to an end of the corner portion of the grid array LSI chip becomes larger.

The grid array electronic component of the present invention (the tenth invention set forth in claim 10), according to claim 2, wherein the auxiliary land is formed at a connection portion around a through hole connected to the wiring pattern on an inner layer printed wiring board of a multilayer printed wiring board constituting the printed wiring board.

The grid array electronic component of the present invention (the eleventh invention set forth in claim 11), according to claim 3, wherein the wiring pattern connected to the land formed with the auxiliary land of the printed wiring board corresponding to a corner portion of the grid array LSI chip is connected to a connection portion formed with an auxiliary land of a via hole on the printed wiring board.

A wire strengthening method of the present invention (the twelfth invention set forth in claim 12) which connects a printed wiring board constituting a grid array electronic component and a grid array LSI chip mounted to the printed wiring board, wherein an auxiliary land is formed at a connection portion between the wire and a land of the printed wiring board corresponding to a land of a corner portion of the grid array LSI chip, thereby strengthening the connection portion of the wire.

The wire strengthening method of the present invention (the thirteenth invention set forth in claim 13), according to claim 12, wherein the connection portion of the wire is strengthened by forming the auxiliary land at the connection portion of the wire of a via hole of the printed wiring board.

A producing method of a grid array electronic component of the present invention (the fourteenth invention set forth in claim 14) for connecting a printed wiring board constituting a grid array electronic component and a grid array LSI chip mounted to the printed wiring board to each other through a wiring pattern, wherein the grid array electronic component having a strengthened connection portion of the wiring pattern is produced by forming an auxiliary land at a connection portion between the wire and a land of the printed wiring board corresponding to a land of a corner portion of the grid array LSI chip.

The producing method of a grid array electronic component of the present invention (the fifteenth invention set forth in claim 15), according to claim 14, wherein the grid array electronic component having the strengthened connection portion of the wire is produced by forming the auxiliary land on the connection portion of the wire and the via hole on the printed wiring board.

A grid array electronic component of the present invention (the sixteenth invention set forth in claim 16) in which a grid array LSI chip having a large number of lands connected to a large number of lands through connecting means, the latter lands are connected to a wire of a printed wiring board, wherein an auxiliary land whose connection cross section area is increased is formed on a connection portion of the land connecting a wiring pattern at a portion where an excessive tensile stress is applied in a producing step between a land in a printed wiring board corresponding to the grid array LSI chip and the wiring pattern which is taken outward to be connected to a via hole as the wire.

A grid array electronic component of the first invention having the above-described construction, in which a grid array LSI chip having a large number of lands connected to a large number of lands through connecting means, the latter lands are connected to a wire of a printed wiring board, wherein an auxiliary land is formed on a connection portion of the land connecting a wiring pattern at a portion where an excessive tensile stress is applied between the lands in the printed wiring board corresponding to the grid array LSI chip and the wiring pattern as the wire.

Therefore, the present invention provides the effect that by moderating the concentration of stress on the connection portion a brake of the wiring pattern in the connection portion is prevented.

The grid array electronic component of the second invention having the above-described construction, according to the first invention, wherein the auxiliary land is formed at the land located on at least a portion where an excessive tensile stress as compared with another portion of the printed wiring board is applied when a load is applied to the printed wiring board. The present invention exhibits the effect that at least concentration of stress on the connection portion of the land connecting to the wiring pattern at the portion where an excessive tensile stress is applied is moderated, thereby preventing a brake of the wiring pattern in the connection portion.

The grid array electronic component of the third invention having the above-described construction, according to the second invention, wherein the auxiliary land is formed on the land located on a portion corresponding to a corner portion of the grid array LSI chip in the printed wiring board, where an excessive tensile stress as compared with another portion of the printed wiring board is applied when a load is applied to the printed wiring board.

Therefore, the present invention provides the effect that a brake of the wiring pattern in the connection portion is prevented by moderating the concentration of stress on the connection portion of the land located on a portion corresponding to a corner portion of the grid array LSI chip on the printed wiring board.

The grid array electronic component of the fourth invention having the above-described construction, according to the second invention, wherein the auxiliary land is formed on the land located on a portion corresponding to an end of an IC chip disposed in the grid array LSI chip on the printed wiring board.

Therefore, the present invention provides the effect that a brake of the wiring pattern in the connection portion is prevented by moderating the concentration of stress on the connection portion between the printed pattern and the land located on a portion corresponding to an end of an IC chip on the printed wiring board.

The grid array electronic component of the fifth invention having the above-described construction, according to the second invention, wherein the auxiliary land is formed at the land connected to the wiring pattern which is formed in a direction in which a warpage of the printed wiring board is generated and in a direction closer to the former direction in a reflow soldering step of the grid array electronic component.

Therefore, the present invention provides the effect that a brake of the wiring pattern in the connection portion is prevented by moderating the concentration of stress on the connection portion between the printed pattern and the land where the excessive tensile stress is applied corresponding to the warpage of the printed wiring board.

The grid array electronic component of the sixth invention having the above-described construction, according to the second invention, wherein the auxiliary land is formed at the land in which an excessive tensile stress is applied to the wiring pattern in a correcting step which corrects warpage and distortion of the printed wiring board or an assembly step.

Therefore, the present invention provides the effect that a brake of the wiring pattern in the connection portion is prevented by moderating the concentration of stress on the connection portion between the printed pattern and the land where the excessive tensile stress is applied to the wiring pattern in the correcting step or the assembly step.

The grid array electronic component of the seventh invention having the above-described construction, according to the second invention, wherein the auxiliary land is formed so that a connection cross section area from the land of the printed wiring board corresponding to the portion of the land of the grid array LSI chip to the wiring pattern is gradually varied.

Therefore, the present invention exhibits the effect that a brake of the wiring pattern in the connection portion is reliably prevented by moderating effectively the concentration of stress on the connection portion when warpage and distortion are generated in the printed wiring board.

The grid array electronic component of the eighth invention having the above-described construction, according to the third invention, wherein the auxiliary land is constituted by an auxiliary land having a different shape in accordance with a position of the land on the printed wiring board corresponding to the land of the corner portion of the grid array LSI chip.

Therefore, the present invention exhibits the effect that a brake of the wiring pattern in the connection portion is prevented by moderating the concentration of stress on the connection portion and by determining the shape of the auxiliary land in consideration of the tensile stress applied to the connection portion between the wiring pattern and the land of the corner portion of the grid array electronic component as well as a shape of the pattern on the printed wiring board.

The grid array electronic component of the ninth invention having the above-described construction, according to the third invention, wherein the auxiliary land is constituted so that an average value of a connection cross section area of a land closer to the printed wiring board corresponding to the land closer to an end of the corner portion of the grid array LSI chip becomes larger.

In the present invention, since the auxiliary land includes a cross section for connection of an average value in accordance with the stress applied to the connection portion when a load is applied to the printed wiring board, the strength of the lands of the corner portion are uniformed, and reliability is enhanced.

The grid array electronic component of the tenth invention having the above-described construction, according to the second invention, wherein the auxiliary land is formed at a connection portion around a through hole connected to the wiring pattern on an inner layer printed wiring board of a multilayer printed wiring board constituting the printed wiring board.

The present invention exhibits the effect that a brake of the wiring pattern in the connection portion is prevented by moderating the concentration of stress of the connection portion between the wiring pattern and the through hole on the inner layer printed wiring board of the multilayer printed wiring board.

The grid array electronic component of the eleventh invention having the above-described construction, according to the third invention, wherein the wiring pattern connected to the land formed with the auxiliary land of the printed wiring board corresponding to a corner portion of the grid array LSI chip is connected to a connection portion formed with an auxiliary land of a via hole on the printed wiring board.

The present invention prevents a brake of the wire in the connection portion of the via hole of the printed wiring board by moderating the concentration of stress of the connection portion of the via hole of the printed wiring board when the load is applied to the printed wiring board.

A wire strengthening method of a wire of the twelfth invention having the above-described construction, which connects a printed wiring board constituting a grid array electronic component and a grid array LSI chip mounted to the printed wiring board, wherein an auxiliary land is formed at a connection portion between the wire and a land on the printed wiring board corresponding to a land of a corner portion of the grid array LSI chip, thereby strengthening the connection portion of the wire.

The present invention prevents a brake of wiring pattern of one end of the printed wiring board on the side of the land. The wire strengthening method of the thirteenth invention having the above-described construction, according to the twelfth invention, wherein the connection portion of the printed wiring board of the wire on the side of the via hole is also strengthened by forming the auxiliary land at the connection portion of the via hole on the printed wiring board connecting the wire and thus, there is effect that brakes on the opposite ends of the wire are prevented.

A producing method of a grid array electronic component of the fourteenth invention having the above-described construction for connecting a printed wiring board constituting a grid array electronic component and a grid array LSI chip mounted to the printed wiring board to each other through a wiring pattern, wherein the grid array electronic component having a strengthened connection portion of the wiring pattern at the side of the land on the printed wiring board is produced by forming an auxiliary land at a connection portion between the wire and a land on the printed wiring board corresponding to a land of a corner portion of the grid array LSI chip.

The producing method of a grid array electronic component of the fifteenth invention having the above-described construction, according to the fourteenth invention, wherein the grid array electronic component having the strengthened connection portion of the wire at the side of the via hole on the print wiring board is produced by forming the auxiliary land at the connection portion of the wire and the via hole on the printed wiring board.

A grid array electronic component of the sixteenth invention having the above-described construction in which a grid array LSI chip having a large number of lands connected to a large number of lands through connecting means, the latter lands are connected to a wire of a printed wiring board, wherein an auxiliary land whose connection cross section area is increased is formed on a connection portion of the land connecting a wiring pattern at a portion where an excessive tensile stress is applied in a producing step between a land in a printed wiring board corresponding to the grid array LSI chip and the wiring pattern which is taken outward to be connected to a via hole as the wire.

Therefore, the invention exhibits the effect that by moderating the concentration of stress of the connection portion the brake of the wire of the wiring pattern at the connection portion is prevented.

BRIEF DESCRIPTION OF THE DRAWINGS

FIG. 9 are explanatory views for explaining steps from a mounting operation of the grid array LSI chip of the fifth embodiment to the printed wiring board to an assembling operation;

FIG. 10 is a plan view showing a printed wiring board to which a grid array LSI chip of a sixth embodiment of the invention is mounted;

BEST MODE FOR CARRYING OUT THE INVENTION

Embodiment of the present invention will be explained below using the drawings.

First Embodiment

Figure 1:
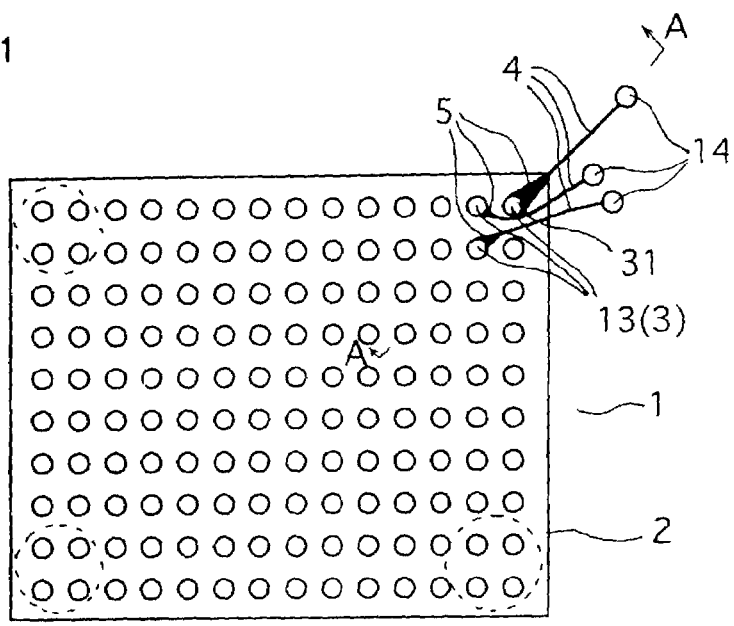
FIG. 1 is a plan view showing a portion of a printed wiring board to which a grid array LSI chip of a first embodiment is mounted.
Figure 2:
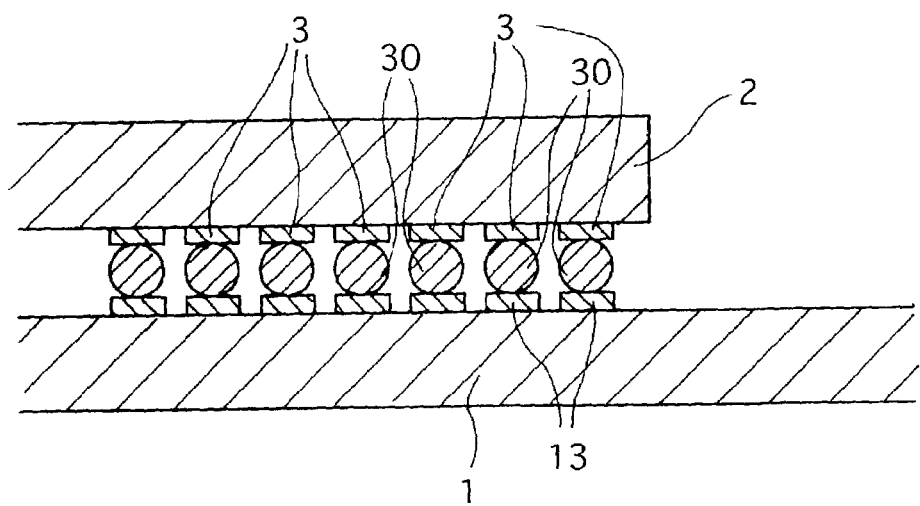
FIG. 2 is a sectional view showing a state in which the grid array LSI chip of the first embodiment is mounted to a printed wiring board.
Figure 3:
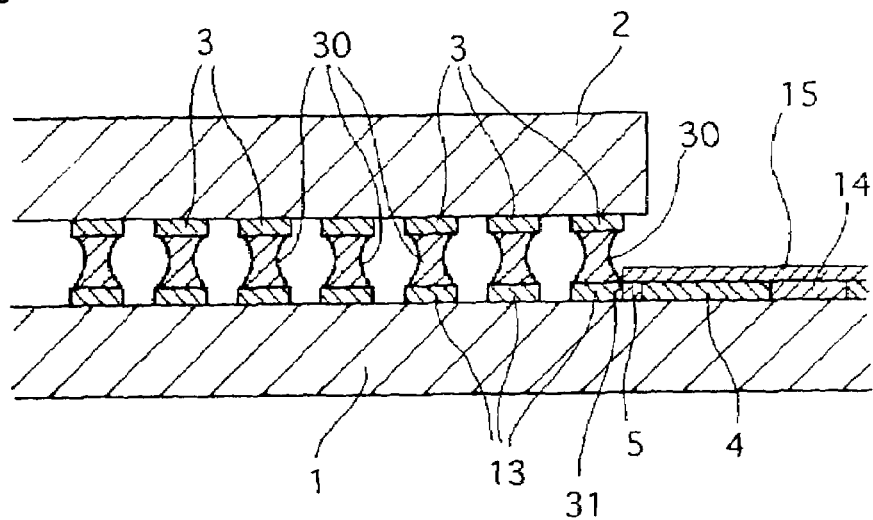
FIG. 3 is a sectional view taken along a line A—A in FIG. 1 showing a state in which the grid array LSI chip of the first embodiment is assembled on the printed wiring board.

As shown in FIGS. 1 to 3, in a grid array electronic component of a first embodiment in which a grid array LSI chip 2 having a large number of lands 3 connected to a large number of lands 13 through connecting means 30, the lands 13 are connected to a wire 4 of a printed wiring board 1, an auxiliary land 5 is formed at a connection portion 31 of the lands 13 on the printed wiring board 1 corresponding to the lands 3 of a corner portion of the grid array LSI chip 2 connecting the wire 4.

As shown in FIG. 2, in the first embodiment, a ball grid array LSI chip in which soldering balls 30 as the connecting means 30 disposed on the lands 3 which are arranged in a form of grid is used as the grid array LSI chip 2 for one sample. As the grid array LSI chip 2, a chip size package including Super CSP of a KGD package capable of being mounted to a surface which realized a real chip size in which the soldering ball is disposed directly on a silicon wafer can be employed other than the ball grid array LSI chip.

The spherical soldering ball 30 as the connecting means 30 disposed on the lands 3 arranged in the form of grid in the ball grid array LSI chip constituting the grid array LSI chip 2 is deformed in a form of tabor as shown in FIG. 3, and the soldering ball 30 and the lands 13 of the printed wiring board 1 corresponding to the lands 3 of the ball grid array LSI chip are welded and electrically connected to each other.

As shown in FIG. 1, a connection cross section area of a tier drop constituting the auxiliary land 5 is gradually reduced, i.e., is formed into a fan-like shape from the lands 3 of a right upper corner portion of the grid array LSI chip 2 which is shown in detail as representative to a wiring pattern constituting the wire 4.

As shown in FIG. 3, the wiring pattern constituting the wire 4 is connected to a via hole 14 formed in the printed wiring board 1, and a resist 15 is applied to an upper portion of the via hole 14.

As shown in FIG. 1, the reinforcing tier drop constituting the auxiliary land 5 is constituted by an auxiliary land of different shape and size in accordance with a position of the land 13 on the printed wiring board 1 corresponding to the land 3 of the corner portion of the grid array LSI chip 2.

That is, the tier drop constituting the auxiliary land 5 is formed so that an average value of its connection cross section area becomes larger as closer to the land 13 of the printed wiring board 1 corresponding to the land 3 closer to an end of the corner portion of the grid array LSI chip 2, and the tier drop formed in the land 13 corresponding to a position closer to the corner portion has wider width and longer length in the longitudinal direction.

According to the grid array electronic component of the first embodiment having the above structure, in the grid array electronic component in which the grid array LSI chip 2 connected to the printed wiring board 1 through the large number of lands 13 and the wire is disposed, the tier drop constituting the auxiliary land 5 is formed at the connection portion 31 of the wiring pattern constituting the wire 4 of the lands 13 on the printed wiring board 1 corresponding to the lands 3 of the corner portion of the grid array LSI chip 2. Therefore, a load is applied to the printed wiring board 1 in a correction step which corrects warpage of the printed wiring board 1 and an assembly step when warpage and distortion are generated in the printed wiring board 1 in a reflow soldering step, concentration of stress of the connection portion 31 when the tensile stress is applied to the connection portion 31 between the lands 3 and the wire 4 is moderated.

To moderate the concentration of stress of the connection portion 31 when the tensile stress is applied is to increase the area (cross section area) of the connection portion 31 to which the tensile stress is applied by forming the auxiliary land 5 whose width is gradually reduced in its longitudinal direction on the connection portion 31 between the lands 3 and the wire 4, and to reduce the tensile stress which is applied per unit area, thereby preventing a great tensile stress from being applied locally, and to strengthen the connection portion 31 by eliminating abrupt variation in area (cross section area) of the connection portion 31 and by eliminating abrupt variation in tensile stress so that the brake is not generated easily even if stress is applied.

According to the grid array electronic component of the first embodiment having the above effect, since the tier drop constituting the auxiliary land 5 is formed at the connection portion 31 between the wiring pattern constituting the wire 4 and the lands 13 on the printed wiring board 1 corresponding to the lands 3 of the corner portion of the grid array LSI chip 2, a load is applied to the printed wiring board 1 in the correcting step and assembly step, the concentration of stress of the connection portion 31 when the tensile stress is applied to the connection portion 31 between the land 3 and the wire 4 is moderated, thereby exhibiting the effect that the brake of the wire of the connection portion is prevented.

According to the grid array electronic component of the first embodiment, since the connection cross section area of the auxiliary land 5 from the lands 13 of the printed wiring board 1 corresponding to the lands 3 of the corner portion of the grid array LSI chip 2 to the wire 4 is gradually varied, a load is applied to the printed wiring board 1 in the correcting step and the assembly step when the warpage and distortion(strain) are generated in the printed wiring board 1, the concentration of stress of the connection portion 31 when the tensile stress is applied to the connection portion 31 between the land 3 and the wire 4 is effectively moderated, thereby exhibiting the effect that the brake of the wire in the connection portion is reliably prevented.

Further, according to the grid array electronic component of the first embodiment, since the auxiliary land 5 is constituted by the tier drop of different shape in accordance with the position of the land 13 of the printed wiring board 1 corresponding to the land 3 of the corner portion of the grid array LSI chip 2, the shape is determined in consideration of the tensile stress applied to the corner portion between the land and the wiring pattern in the corner portion of the grid array electronic component as well as the pattern shape of the printed wiring board corresponding to the corner portion of the grid array electronic component, and the concentration of stress of the connection portion 31 is moderated, thereby providing the effect that the brake of the wire in the connection portion 31 is prevented.

According to the grid array electronic component of the first embodiment, the tier drop constituting the auxiliary land 5 is constituted so that its average value of the connection cross section area is greater as closer to the land 13 of the printed wiring board 1 corresponding to the land close to the end of the corner portion of the grid array LSI chip 2. Therefore, since the tier drop constituting the auxiliary land 5 includes the connection cross section area of average value in accordance with the stress applied to the connection portion 31 when the load is applied to the printed wiring board 1, there is effect that the strength of the lands 13 of the printed wiring board 1 corresponding to the corner portion is uniformed, and the reliability is enhanced.

Second Embodiment

Figure 4:
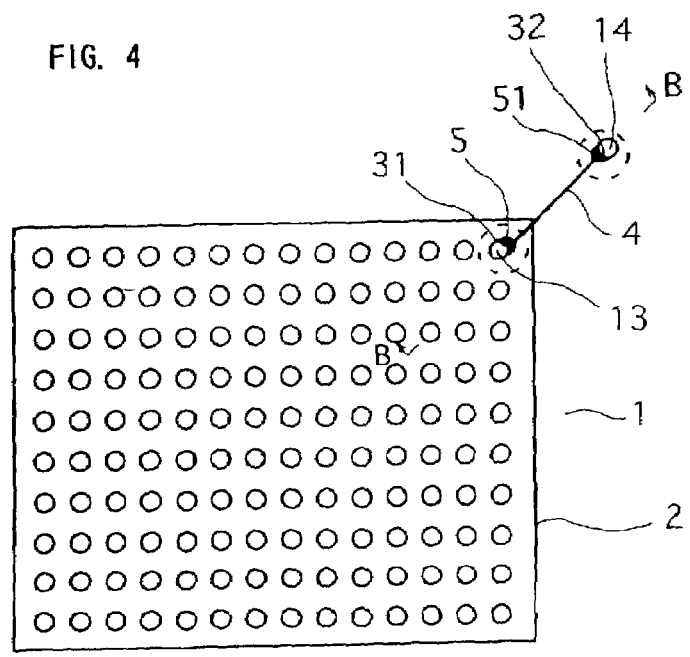
FIG. 4 is a plan view showing a portion of the printed wiring board to which a grid array LSI chip of a second embodiment of the present invention is mounted and showing a wire strengthening method.
Figure 5:
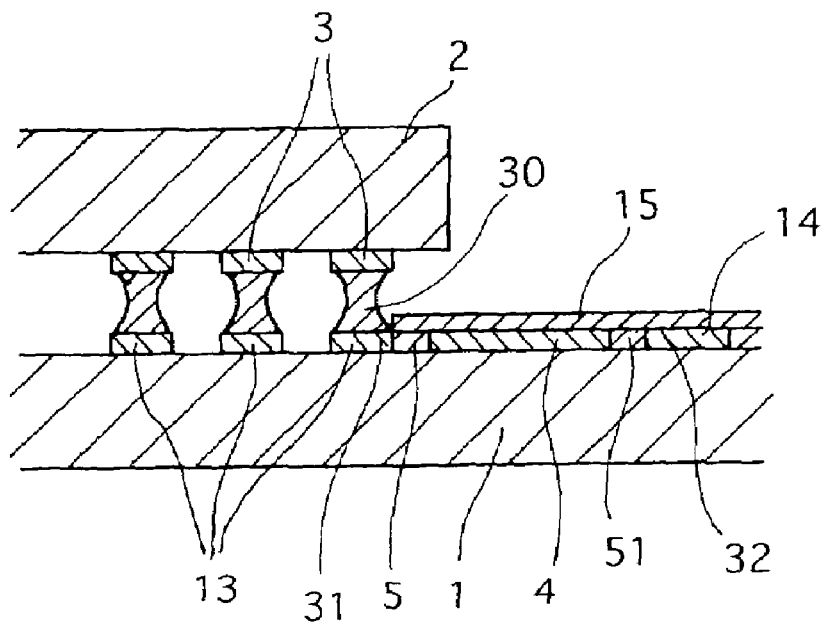
FIG. 5 is a sectional view taken along a line B—B in FIG. 4 showing a state in which the grid array LSI chip of the second embodiment is assembled on the printed wiring board.

As shown in FIGS. 4 and 5, a grid array electronic component, a producing method and a wire strengthening method of a second embodiment are different from those of the first embodiment in that an auxiliary land 51 is also formed at the via hole 14 of the printed wiring board 1, and the difference will be mainly explained below.

As shown in FIGS. 4 and 5, in the grid array electronic component of the second embodiment, the wire 4 (pattern) connected to the land 13 formed with the semi-circular auxiliary land 5 of the printed wiring board 1 corresponding to the corner portion of the grid array LSI chip 2 is connected to the connection portion 32 formed with the semi-circular auxiliary land 51 in the via hole 14 of the printed wiring board 1.

According to the wire strengthening method and the producing method of grid array electronic component according to the second embodiment, in which on the wire 4 connected the printed wiring board 1 and the grid array LSI chip 2 mounted to the printed wiring board 1, the auxiliary land 5 is formed at the connection portion 31 between the wire 4 and the land 13 on the printed wiring board 1 corresponding to the land 3 of the corner portion of the grid array LSI chip 2, the auxiliary land 51 is formed on the connection portion 32 between the wire 4 and the via hole 14 of the printed wiring board 1, thereby strengthening the connection portion 32 of the wire pattern 4, and thereby producing the grid array electronic component having the strengthened connection portion 32 of the wire pattern 4.

In the grid array electronic component of the second embodiment having the above structure, the wire 4 connected to the auxiliary land 3 formed at the land 13 of the printed wiring board 1 corresponding to the land 3 of the corner portion of the grid array LSI chip 2 is connected to the connection portion 32 formed with the auxiliary land 51 of the via hole 14 on the printed wiring board 1. Therefore, the concentration of stress of the connection portion 32 of the via hole 14 on the printed wiring board 1 when a load is applied to the printed wiring board 1 is moderated.

According to the grid array electronic component of the second embodiment having the above effect, the wire 4 connected to the auxiliary land 3 formed at the land 13 of the printed wiring board 1 is connected to the connection portion 32 formed with the auxiliary land 51 of the via hole 14 on the printed wiring board 1. Therefore, if the concentration of stress of the connection portion 32 of the via hole 14 of the printed wiring board 1 when the load is applied to the printed wiring board 1 and the warpage and distortion are generated is moderated, there is effect that the brake of the wire 4 of the connection portion 32 of the via hole 14 on the printed wiring board 1 is prevented.

According to the grid array electronic component of the second embodiment, when a distance between the via hole 14 and the land 13 of the printed wiring board 1 is short, i.e., when the wire 4 is short, since there is a possibility that a large stress is applied to the connection portion between the via hole 14 and the wire 4, the auxiliary land 51 is effective.

According to the wire strengthening method and the producing method of the grid array electronic component of the second embodiment, in the wire 4 which connects the printed wiring board 1 and the grid array LSI chip 2 mounted to the printed wiring board 1, the auxiliary land 5 is formed at the connection portion 31 between the wire 4 and the land 13 of the printed wiring board 1 corresponding to the land 3 of the corner portion of the grid array LSI chip 2, and the auxiliary land 51 is formed at the connection portion 32 between the wire 4 and the via hole 14 of the printed wiring board 1, thereby exhibiting the effect that the corner portions 31 and 32 of the opposite ends of the wire 4 are strengthened, and it is possible to produce the grid array electronic component in which the brake of each of the opposite ends of the wire 4 is prevented.

Third Embodiment

Figure 6:
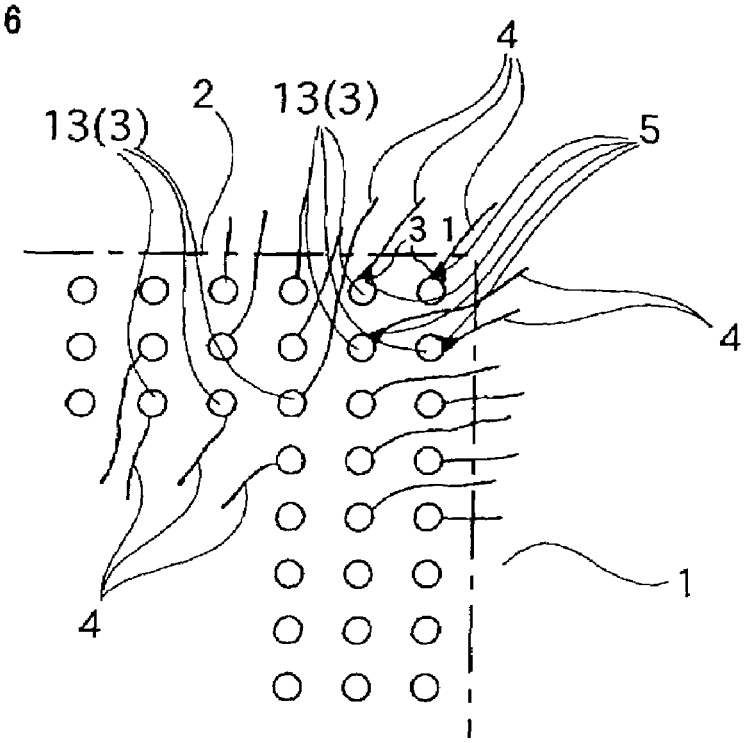
FIG. 6 is a partially enlarged plan view showing a portion of a printed wiring board to which a grid array LSI chip of a third embodiment of the invention is mounted.

As shown in FIG. 6, a grid array electronic component of a third embodiment is different from the first embodiment in that the present invention is applied to a frame-like grid array LSI chip 2 in which no ball grid is disposed in a central rectangular region, and the different portion will be explained mainly.

Auxiliary lands 5 are formed on the connection portions 31 of the wiring patterns 4 corresponding to the lands 3 of the four corner portions of the frame-like grid array LSI chip 2, and the wiring patterns 4 are taken(led) outward radially from the lands 13.

In the third embodiment, as shown in FIG. 6, the wiring patterns 4 are taken inward from the lands 13 inside the frame-like grid array LSI chip 2.

According to the grid array electronic component of the third embodiment having the above structure, since the tier drops constituting the auxiliary lands 5 are formed at the connection portions 31 of the wiring patterns which are taken out and which constitute the wires 4 of the lands 13 of the printed wiring board 1 corresponding to the lands 3 of the corner portions of the grid array LSI chip 2, a load is applied to the printed wiring board 1, the concentration of stress of the connection portion 31 when the tensile stress is applied to the connection portion 31 between the lands 3 and the wiring patterns 4 is moderated, thereby exhibiting the effect that the brakes of the wiring patterns 4 in the connection portions 31 are prevented.

Fourth Embodiment

Figure 7:
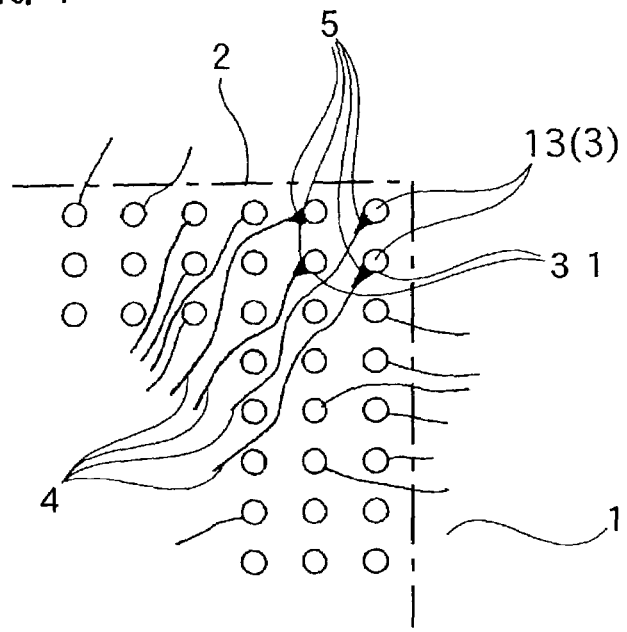
FIG. 7 is a partially enlarged plan view showing a portion of a printed wiring board to which a grid array LSI chip of a fourth embodiment of the invention is mounted.

As shown in FIG. 7, the grid array electronic component of a fourth embodiment is different from that of the third embodiment in that the wiring patterns 4 are taken inward radially from the lands 13 in the printed wiring board 1 corresponding to the lands 3 of the four corner portions of the frame-like grid array LSI chip 2, and the difference will be mainly explained below.

That is, the auxiliary land 5 is formed on the connection portion 31 between the land 13 and the wire pattern 4 which is taken inward radially from the land 13 of the corner portion of the frame-like grid array LSI chip 2 and which is connected to a central trough hole (not shown).

According to the grid array electronic component of the fourth embodiment having the above structure, since the tier drop constituting the auxiliary land 5 is formed at the connection portion 31 between the wiring pattern which constitutes the wire 4 and which is taken inward and the land 13 of the printed wiring board 1 corresponding to the land 13 of the corner portion of the grid array LSI chip 2, a load is applied to the printed wiring board 1 and the concentration of stress of the connection portion 31 when the tensile stress is applied to the connection portion 31 between the land 13 and the wire 4 is moderated, thereby exhibiting the effect that the brake of the wire pattern 4 in the connection portion 31 is prevented.

Fifth Embodiment

Figure 8:
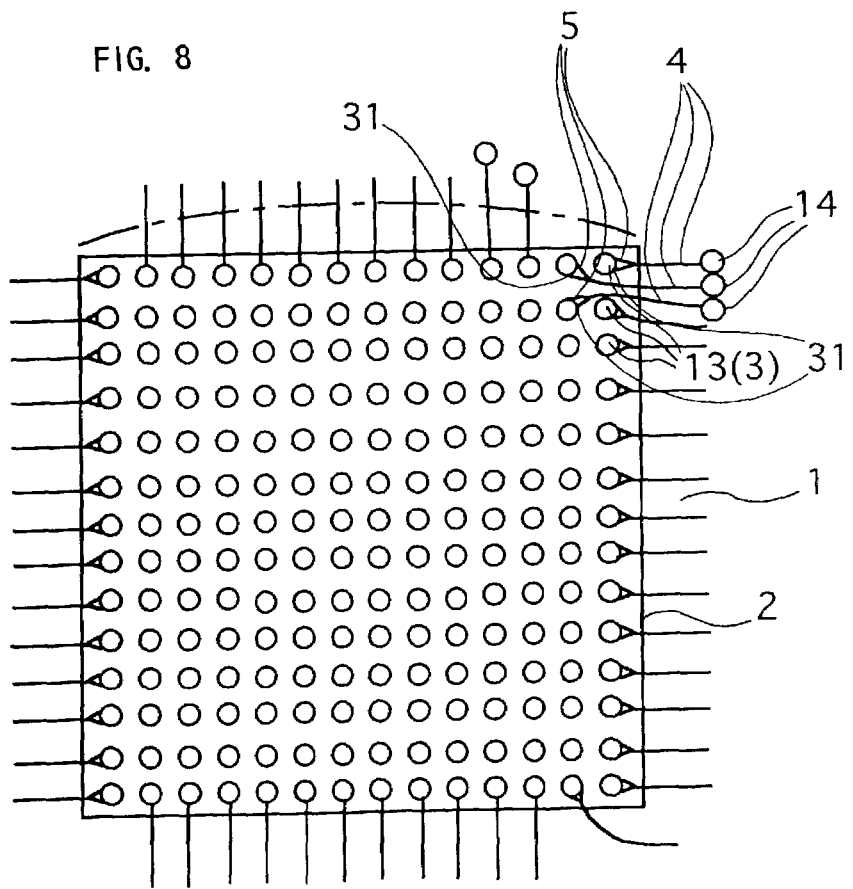
FIG. 8 is a plan view showing a portion of a printed wiring board to which a grid array LSI chip of a fifth embodiment of the invention is mounted.

As shown in FIG. 8, a grid array electronic component of a fifth embodiment is different from the above embodiment in that the auxiliary land 5 is formed in the land 3 connected to the wire pattern 4 which is formed in a direction in which a warpage is generated in the printed wiring board 1 generated in the reflow soldering step of the grid array electronic component (shown with chain line in FIG. 8) and in a direction close to the former direction, and the difference will be mainly explained below.

In the fifth embodiment, as shown in FIG. 9(A), conveyer frames are disposed in parallel to each other, the printed wiring board 1 is placed on the conveyer frames so that opposite ends of the printed wiring board 1 in a width wise direction are retained to the conveyer frames, a screen printing board is placed thereon, and cream soldering is printed and applied.

Next, as shown in FIG. 9(B), the grid array electronic component 2 is mounted, by a mounter, to an upper surface and/or lower surface of the printed wiring board 1 on which the cream soldering is printed and applied.

Then, as shown in FIG. 9(C), the printed wiring board 1 to which the grid array electronic component 2 is mounted is brought into the reflow furnace, and soldering is carried out. At that time, a temperature of the upper surface of the printed wiring board 1 is higher than that of the lower surface of the printed wiring board 1 in the reflow furnace, and arc (U-shape) warpage is generated downwardly by its own weight.

Next, as shown in FIG. 9(D), in order to correct the printed wiring board 1 in which the downward arc (U-shape) warpage is generated, a central portion of the printed wiring board 1 is pushed upward from below, and a plurality of portions of the opposite sides of the printed wiring board 1 are pushed downward from above, this pushing state is maintained for a certain time, thereby correcting the printed wiring board 1 horizontally.

A pin is brought into abutment against a lead of the electronic component of the printed wiring board 1 which was corrected horizontally, individual operations are checked and then, it is assembled into a casing and screwed.

In the fifth embodiment, in the correcting step in which in order to correct the printed wiring board 1 in which the downward arc (U-shape) warpage is generated in the reflow soldering step, a central portion of the printed wiring board 1 is pushed upward from below, a plurality of portions of the opposite sides of the printed wiring board 1 are pushed downward from above, the pushing state is maintained for a certain time, and the printed wiring board 1 is corrected horizontally, since the opposite sides of the printed wiring board 1 which is warped downward are bent downward, a great tensile stress is applied to the connection portion 31 between the land 13 and the wire pattern 4, but the auxiliary land 5 whose width is gradually reduced is formed at the connection portion 31 between the land 3 and the wire pattern 4 which is formed in a direction in which the warpage is generated in the printed wiring board 1 and in a direction close to the former direction, the concentration of stress of the connection portion 31 between the land 3 and the wire pattern 4 is moderated.

According to the grid array electronic component of the fifth embodiment having the above structure, since the tier drops constituting the auxiliary lands 5 are formed at the connection portions 31 (of all the lands 3 on the opposite ends in the lateral direction in FIG. 8) between the lands 13 of the printed wiring board 1 corresponding to the lands 3 of the corner portion of the grid array LSI chip 2 and the wire patterns 4 formed in the direction of warpage of the printed wiring board 1 (shown with chain line in FIG. 8) constituting the wire 4, the concentration of stress of the connection portion 31 is moderated when a load is applied to the printed wiring board 1 in the correcting step or the assembling step and the tensile stress is applied to the connection portion 31 between the land 3 and the wire pattern 4, thereby exhibiting the effect that the brake of the wire pattern 4 in the connection portion 31 is prevented.

Sixth Embodiment

A grid array electronic component of a sixth embodiment is different from the fifth embodiment in that the present invention is applied to a frame-like grid array LSI chip 2 shown in FIG. 10.

In the sixth embodiment, the auxiliary lands 5 are formed on the lands 3 connected to the wiring patterns 4 formed in a direction (shown with chain line in FIG. 10) in which warpage is generated on the printed wiring board 1 during the reflow soldering step of the grid array electronic component and in a direction close to the former direction like the fifth embodiment and the same effect is exhibited and thus, explanation thereof will be omitted.

Seventh Embodiment

Figure 11:
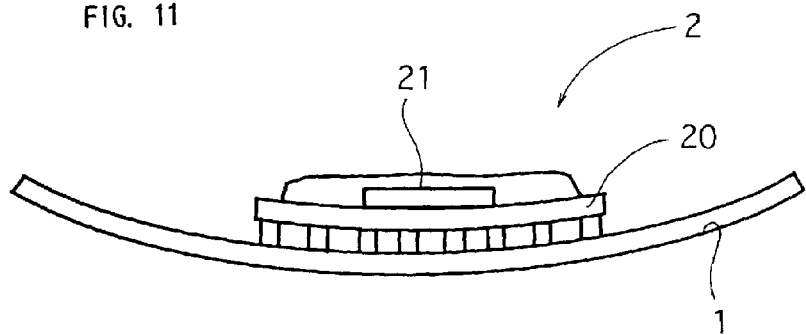
FIG. 11 is a front view showing a state in which a printed wiring board to which a grid array LSI chip of a seventh embodiment of the invention is mounted is warped, as viewed from front side of an in-circuit tester.

A grid array electronic component of a seventh embodiment is different from the above embodiment in that a relatively small IC chip 21 is disposed on a central portion of a plastic package in which soldering ball grids are disposed on an entire surface in a form of grid like the fifth embodiment (FIG. 8) as shown in FIG. 11, and the grid array LSI chip 2 in which the entire upper surface of the plastic package 20 is sealed with resin is mounted on the printed wiring board 1.

In the seventh embodiment, since the rigidity of the plastic package 20 which supports the entire grid array LSI chip 2 is low, it is assumed that a portion of the plastic package 20 of the grid array LSI chip 2 is also warped when the printed wiring board 1 is warped downward in a form of arc (U-shape) in the reflow soldering step.

Figure 12:
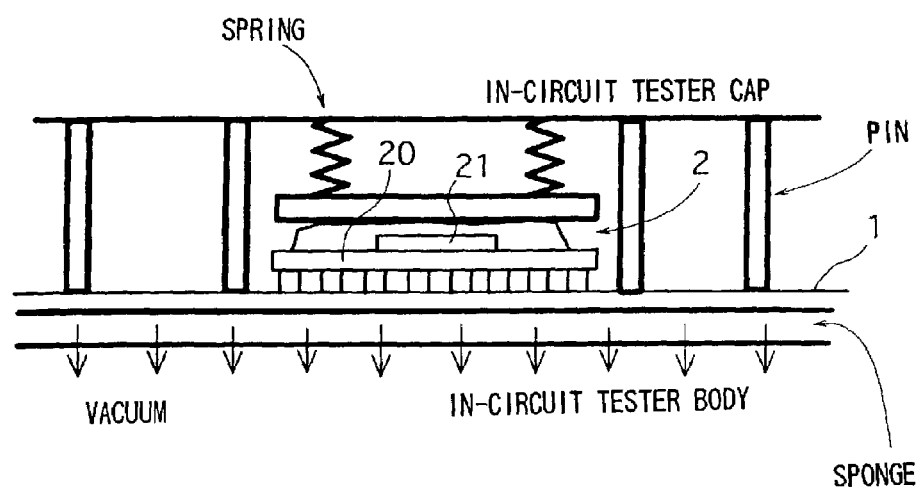
FIG. 12 is a front view of showing a state of an in-circuit tester of a printed wiring board to which the grid array LSI chip of the seventh embodiment is mounted, as viewed from front side.

Therefore, in order to correct the printed wiring board 1 which was warped (that is, it is assumed that stress generated when distortion was corrected when the printed wiring board 1 was mounted to the in-circuit tester is also generated in the connection portion of the wiring pattern of the land and the brake is generated), when the printed wiring board 1 is horizontally corrected by a plurality of resin pins and springs in the in-circuit tester body as shown in FIG. 12, since it is assumed that a large stress is applied to the end of the IC chip 21 from the corner portion of the plastic package 20, in the seventh embodiment, the auxiliary land is provided on the connection portion between the land 3 and the wire pattern 4 in this range. The correction can be applied to all of the above embodiments.

According to the grid array electronic component of the seventh embodiment having the above structure, since the auxiliary land 5 is formed at the land 3 located on a position corresponding to the end of the IC chip 21 disposed on the grid array LSI chip 2 of the printed wiring board 1, the concentration of stress of the connection portion 31 between the wire pattern 4 and the land 3 located on the position corresponding to the end of the IC chip 21, thereby providing the effect that the brake of the wire pattern 4 of the connection portion 31 is prevented.

Eighth Embodiment

Figure 13:
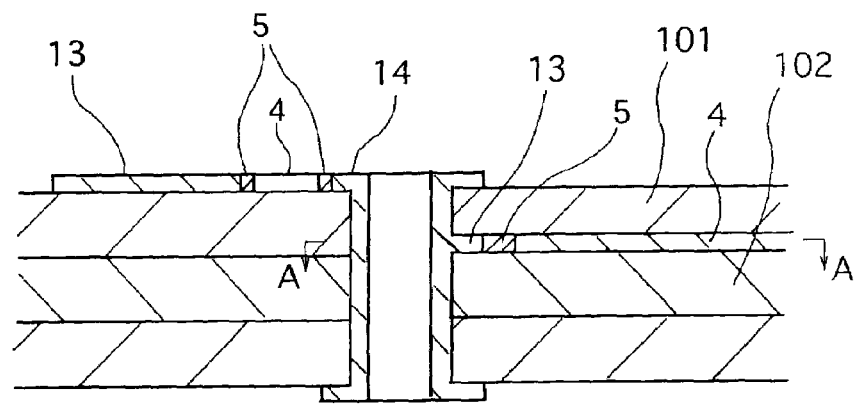
FIG. 13 is a sectional view showing an inner structure of a multilayer printed wiring board to which a grid array LSI chip of an eighth embodiment of the invention is mounted.
Figure 14:
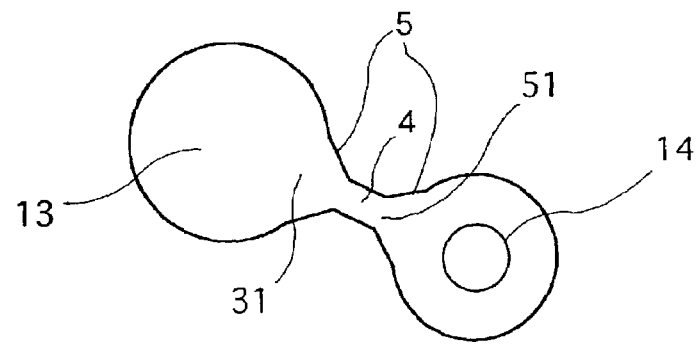
FIG. 14 is a partial plan view showing lands, wiring pattern and via holes on the printed wiring board of a first layer of the eighth embodiment.
Figure 15:
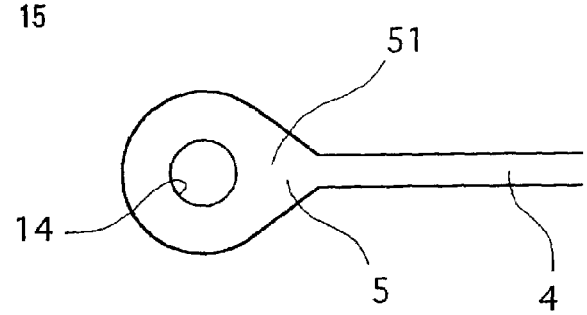
FIG. 15 is a partial plan view showing a wiring pattern and a via hole on a second layer printed wiring board of the eighth embodiment.

As shown in FIGS. 13 to 15, the grid array electronic component of an eighth embodiment is different from the above embodiments in that the auxiliary land 5 is formed at a connection portion 51 around the via hole 14 as a through hole connected to the wire pattern 4 on the inner layer printed wiring board of a multilayer printed wiring board 1 constituting the printed wiring board 1, and the difference will be mainly explained below.

Auxiliary lands 5 whose widths are gradually reduced are formed on the connection portions 31 and 51 of the wire pattern 4 which connects the land 13 and the via hole 14 as shown in FIG. 14 on the upper surface of the first layer 101 of the multilayer printed wiring board 1.

As shown in FIG. 15, an auxiliary land 5 whose width is gradually reduced is formed on the connection portion 51 which connects the via hole 14 and the wire 4 on the upper surface of the second layer 102 of the multilayer printed wiring board 1.

As shown in FIG. 13, the via hole 14 is formed by penetrating the multilayer printed wiring board 1.

According to the grid array electronic component of the eighth embodiment having the above structure, since the auxiliary land 5 is formed at the connection portion 51 around the via hole 14 as the through hole connected to the wire pattern 4 on the inner layer printed wiring board of the multilayer printed wiring board constituting the printed wiring board 1, the concentration of stress of the connection portion 51 between the wire pattern 4 and the through hole 14 on the inner layer printed wiring board of the multilayer printed wiring board when a load is applied to the multilayer printed wiring board 1 is moderated, thereby exhibiting the effect that the brake of the wire pattern 4 in the connection portion 51 is prevented.

Further, according to the grid array electronic component of the eighth embodiment, since the auxiliary lands 5 whose widths are gradually reduced are formed on the connection portions 31 and 51 of the wiring patterns 4 which connect the land 13 and the via hole 14 as shown in FIG. 14 on the upper surface of the first layer 101 of the multilayer printed wiring board 1, the concentration of stress of the connection portions 31 and 51 of the wire pattern 4 which connects the land 13 and the via hole 14 when a load is applied to the multilayer printed wiring board 1 is moderated, thereby exhibiting the effect that the brake of the wire pattern 4 of the connection portion 51 is prevented.

The preferred embodiments of the present invention, as herein disclosed, are taken as some embodiments for explaining the present invention. It is to be understood that the present invention should not be restricted by these embodiments and any modifications and additions are possible so far as they are not beyond the technical idea or principle based on descriptions of the scope of the patent claims.

Figure 16:
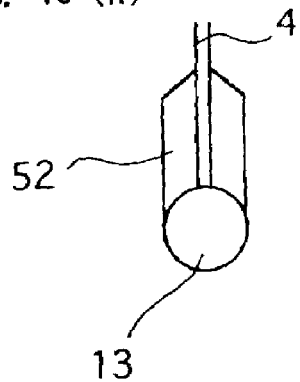
FIG. 16 is a partial enlarged view showing a shape of another auxiliary land of the present invention.
Figure 16:
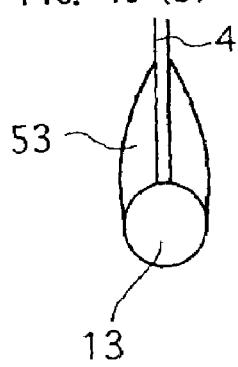
Figure 16:
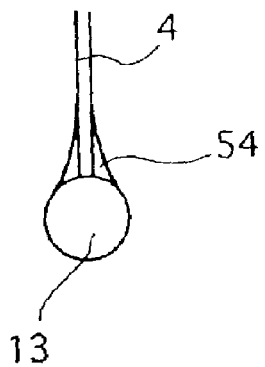

Although the fan-like and semi-circular auxiliary lands are explained in the above embodiments, the present invention is not limited to those, and as shown in FIG. 16, an auxiliary land comprising parallel lines and a tapered portion (FIG. 16(A)), an auxiliary land comprising a projected arc portion (FIG. 16(B), an auxiliary land comprising a recessed arc portion (FIG. 16(C)) and the other modes can also be employed.

Figure 17:
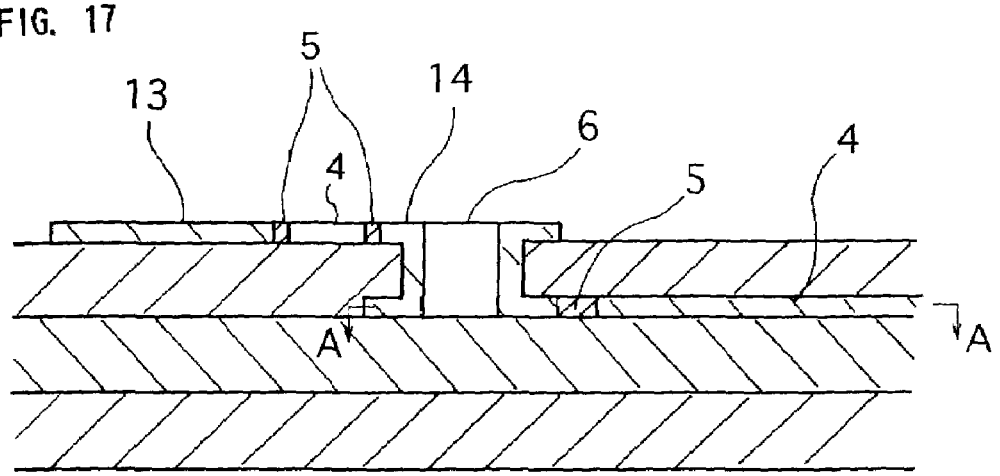
FIG. 17 is a sectional view showing an inner structure of a multilayer printed wiring board to which a grid array LSI chip of a modification of the eighth embodiment of the invention is mounted.
Figure 18:
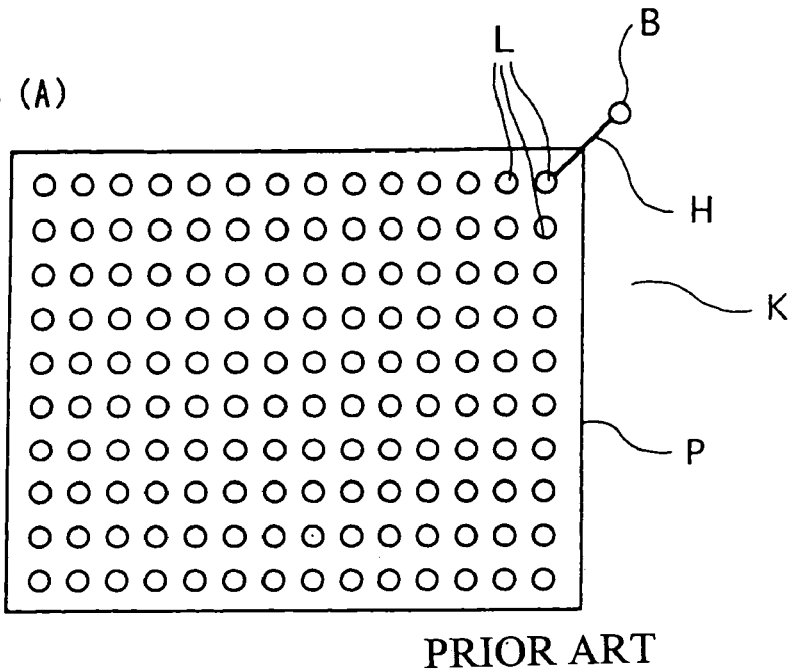
FIG. 18 are plan views showing a printed wiring board to which a conventional grid array LSI chip is mounted.
Figure 18:
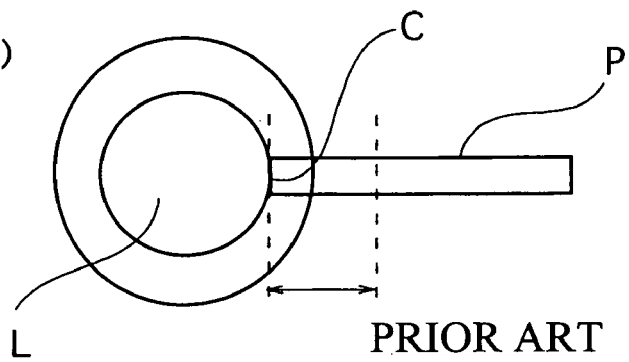
Figure 19:
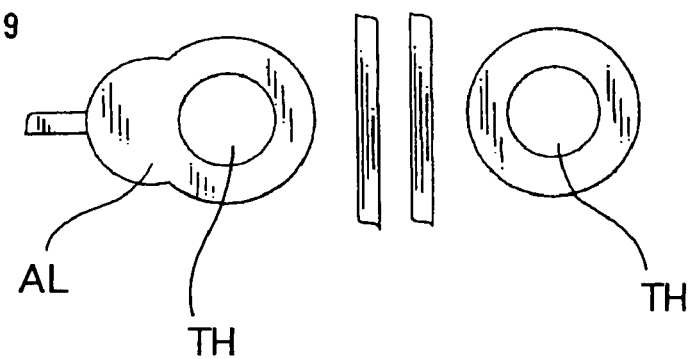
FIG. 19 is a partial plan view showing a wiring board having a conventional land.
Figure 20:
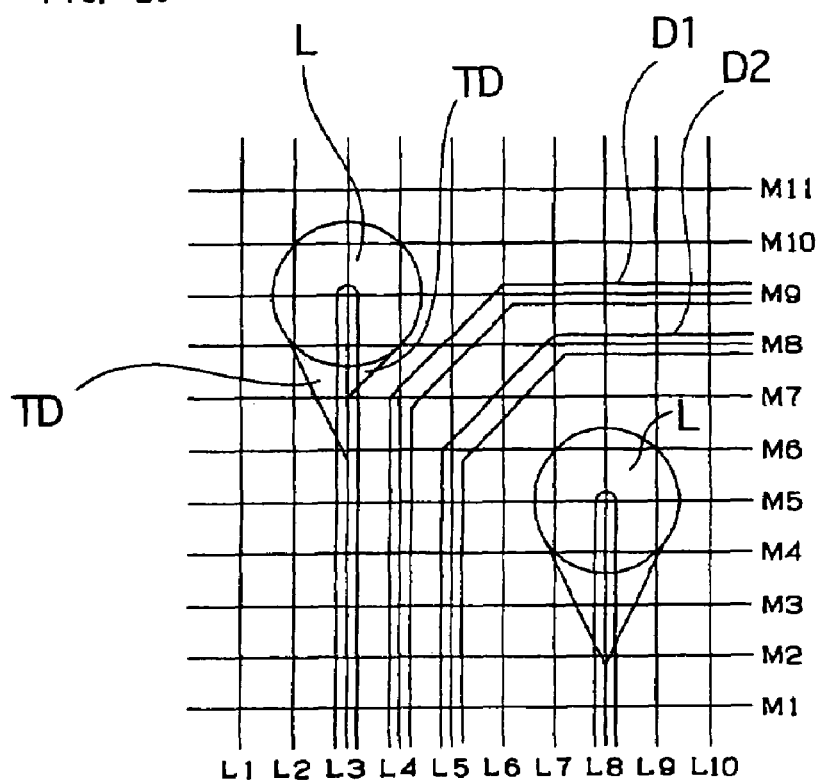
FIG. 20 is a partial plan view showing a conventional printed wiring board.
Figure 21:
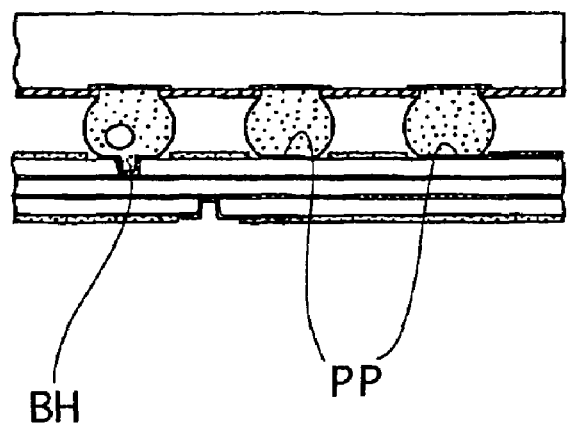
FIG. 21 is a partial sectional view showing a mounting structure of a conventional ball grid array package.

Although the via hole 14 is formed by penetrating the multilayer printed wiring board 1 as one example in the eighth embodiment, the present invention is not limited to this, and the via hole 14 may be formed so that it penetrates only the first layer of the multilayer printed wiring board 1 or an arbitrary layer thereof as shown in FIG. 17.

The auxiliary land is formed on the land of the printed wiring board at a portion corresponding to a portion where an excessive tensile stress of the grid array LSI chip is applied when a load is applied to the printed wiring board in the above embodiment, the present invention is not limited to this, and when there exist a plurality of portion where excessive tensile stress of the grid array LSI chip is applied, or when the portions are changed, or when the portion is in wide range, a mode in which the auxiliary land is formed at an entire land including the entire edge or interior of the grid array LSI chip can also be employed.

Although the opposite ends of the printed wiring board in its widthwise direction are supported by the conveyer frame in the reflow soldering step as one example in the fifth embodiment, the present invention is not limited to this, and it is possible to employ a mode in which the printed wiring board is supported by a mesh-like supporting through which heat and airflow can circulate or pass or by a supporting body in which a large number of supporting pins are embedded, and warpage and distortion of the printed wiring board are prevented from being generated.

What is claimed is:

1. An electronic component comprising:
a board;
a semiconductor device comprising a plurality of first lands formed in a grid and electrically connected to corresponding second lands formed on the board,
wherein a subset of the second lands corresponding to first lands in a corner portion or end portion of the grid each comprise a primary land and an auxiliary land,
each of the subset of second lands connect to a wire of the board,
the primary land comprises an arcuate shape, and
the auxiliary land comprises a first portion disposed adjacent the primary land and a second portion connecting to the wire, the first portion having a greater cross sectional area than the second portion, and
wherein (a) the connecting wire for each land of the subset of second lands comprises a via land, the via land including an arcuate portion electrically connected to a via hole formed in the board outside of the footprint of the grid of the semiconductor device and (b) a predetermined tensile stress is configured to be applied between the subset of second lands and their respective connecting wires.

2. The electronic component according to claim 1, wherein said auxiliary land is configured to be disposed where the predetermined tensile stress is applied when a load is applied to said board.

3. The electronic component according to claim 2, wherein said auxiliary land electrically connects with at least one of the first lands at a corner of the semiconductor device.

4. The electronic component according to claim 3, wherein said auxiliary land has a shape determined based on a position of the auxiliary land in relation to a corner of the semiconductor device.

5. The electronic component according to claim 3, wherein said auxiliary land comprises an arcuate shape.

6. The electronic component according to claim 2, wherein said auxiliary land electrically connects with at least one of the first lands at an end of an integrated circuit of the semiconductor device.

7. The electronic component according to claim 2, wherein said auxiliary land is configured to be disposed so as to extend in a direction in which a warpage of said board is generated.

8. The electronic component according to claim 2, wherein said auxiliary land is configured to be disposed where the predetermined tensile stress is applied during correction of a distortion of said board during an assembly of the semiconductor device to the board.

9. The electronic component according to claim 2, wherein said auxiliary land comprises a third portion disposed between the first and second portions, the third portion having a cross sectional area less than the first portion and greater than the second portion.

10. The electronic component according to claim 2, wherein the at least one second land comprises a second auxiliary land disposed adjacent a through hole.

11. An electronic component comprising:
a printed wiring board;
a semiconductor device comprising a plurality of first lands formed in a grid and electrically connected to corresponding second lands formed on the printed wiring board,
wherein a subset of the second lands corresponding to first lands in a corner portion or end portion of the grid each comprise a primary land and an auxiliary land,
each of the subset of second lands connects to a wire of the printed wiring board,
the primary land comprises an arcuate shape, and
the auxiliary land comprises a first portion disposed adjacent the primary land and a second portion connecting to the wire, the first portion having a greater cross sectional area than the second portion, and
wherein (a) the connecting wire for each land of the subset of second lands comprises a via land, the via land including an arcuate portion electrically connected to a via hole formed in the printed wiring board outside of the footprint of the grid of the semiconductor device and (b) a predetermined tensile stress is configured to be applied between the subset of second lands and their respective connecting wires.

12. An electronic component, comprising:
a semiconductor device having a footprint, and comprising at least one semiconductor land;
a board comprising at least one board land, each of said at least one semiconductor lands electrically connected to a corresponding board land of the at least one board lands, the corresponding board lands including a primary portion contacting the at least one semiconductor land and an auxiliary portion electrically connected to a wire, wherein the primary portion comprises an arcuate shape, and the auxiliary portion comprises a first portion electrically connected to the primary portion and a second portion electrically connected to the wire, the first portion having a greater cross sectional area than the second portion, and wherein the wire for each corresponding board land comprises a via land, the via land including an arcuate portion electrically connected to a via hole formed in the board outside of the footprint of the semiconductor device.

13. The electronic component according to claim 12, wherein the primary portion comprises a circular shape.

14. The electronic component according to claim 12, wherein the auxiliary portion has an about triangular shape.

15. The electronic component according to claim 12, wherein the auxiliary portion has a tapered shape.

16. The electronic component according to claim 12, wherein the auxiliary portion has a tear drop shape.

17. The electronic component according to claim 12, wherein the auxiliary portion has a third portion between the first and second portions, the third portion having a cross sectional area between the cross sectional areas of the first and second portions.

\* \* \* \* \*